United States Patent
Ko

(10) Patent No.: US 10,693,486 B1
(45) Date of Patent: Jun. 23, 2020

(54) ASYNCHRONOUS SAR ADC WITH ADAPTIVE TUNING COMPARATOR

(71) Applicant: Avago Technologies international Sales Pte. Limited, Singapore (SG)

(72) Inventor: Yen-Jen Ko, Zhubei (TW)

(73) Assignee: AVAGO TECHNOLOGIES INTERNATIONAL SALES PTE. LIMITED, Singapore (SG)

( * ) Notice: Subject to any disclaimer, the term of this patent is extended or adjusted under 35 U.S.C. 154(b) by 0 days.

(21) Appl. No.: 16/428,366

(22) Filed: May 31, 2019

(51) Int. Cl.
| | |
|---|---|
| H03M 1/46 | (2006.01) |
| H04L 7/033 | (2006.01) |
| H03K 3/0233 | (2006.01) |
| H03L 7/08 | (2006.01) |

(52) U.S. Cl.
CPC .......... *H03M 1/462* (2013.01); *H03K 3/0233* (2013.01); *H03L 7/08* (2013.01); *H04L 7/0331* (2013.01)

(58) Field of Classification Search
CPC ....... H03M 1/462; H03K 3/0233; H03L 7/08; H04L 7/0331
See application file for complete search history.

(56) References Cited

U.S. PATENT DOCUMENTS

| | | | | |
|---|---|---|---|---|
| 2014/0210653 A1* | 7/2014 | Harpe | ................. | H03M 1/0697 341/110 |
| 2015/0280728 A1* | 10/2015 | Singh | .................... | H03M 1/462 341/122 |
| 2016/0254821 A1* | 9/2016 | Luo | ....................... | H03M 1/125 341/161 |

OTHER PUBLICATIONS

Wang, et al., High-speed single-channel SAR ADC with a novel control logic in 65 nm CMOS. Analog Integr Circ Sig Process 91, 503-511 (2017). (Year: 2017).*
M. Ensafdaran et al ("High speed SAR ADC using fast conversion loop," 2014 IEEE Radio and Wireless Symposium (RWS), Newport Beach, CA, 2014, pp. 193-195). (Year: 2014).*
Vito Giannini et al., "An 820pW 9b 40MS s Noise-Tolerant Dynamic-SAR ADC in 90nm Digital", ISSCC 2008/Session 12/High-Efficiency Data Converters/12.1, 3 pp.
Takaaki Ito et al., "A 40-kS s 16-bit non-binary SAR ADC in 0.18 CMOS with noise-tunable", Department of Electrical Engineering and Information Systems, The University of Tokyo, Japan/ VLSI Design and Education Center (VDEC), The University of Tokyo, Japan, 4 pp.

* cited by examiner

*Primary Examiner* — Jaison Joseph
(74) *Attorney, Agent, or Firm* — Xsensus LLP

(57) ABSTRACT

An apparatus and method for an asynchronous successive approximation analog-to-digital converter that includes a digital-to-analog converter, a comparator with adjustable integration time electrically coupled to the digital-to-analog converter, and control circuitry electrically coupled to the digital-to-analog converter and the comparator, the control circuitry configured to adjust an integration time of the comparator one or more times during a conversion cycle.

20 Claims, 9 Drawing Sheets

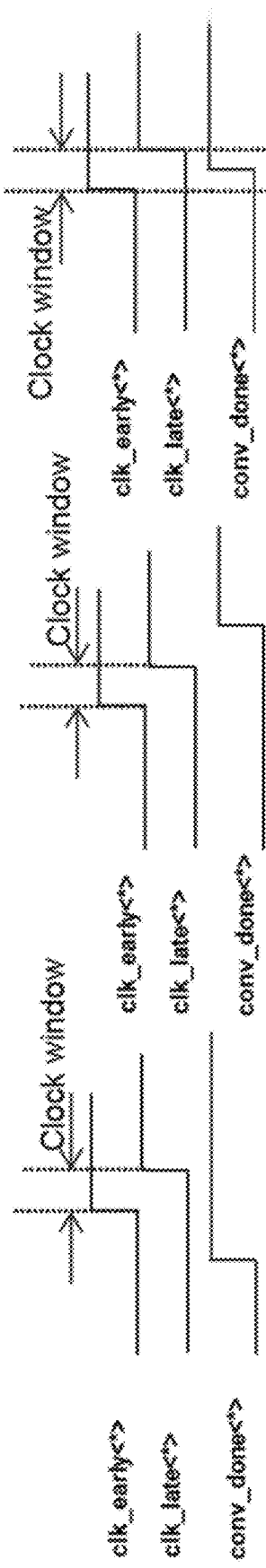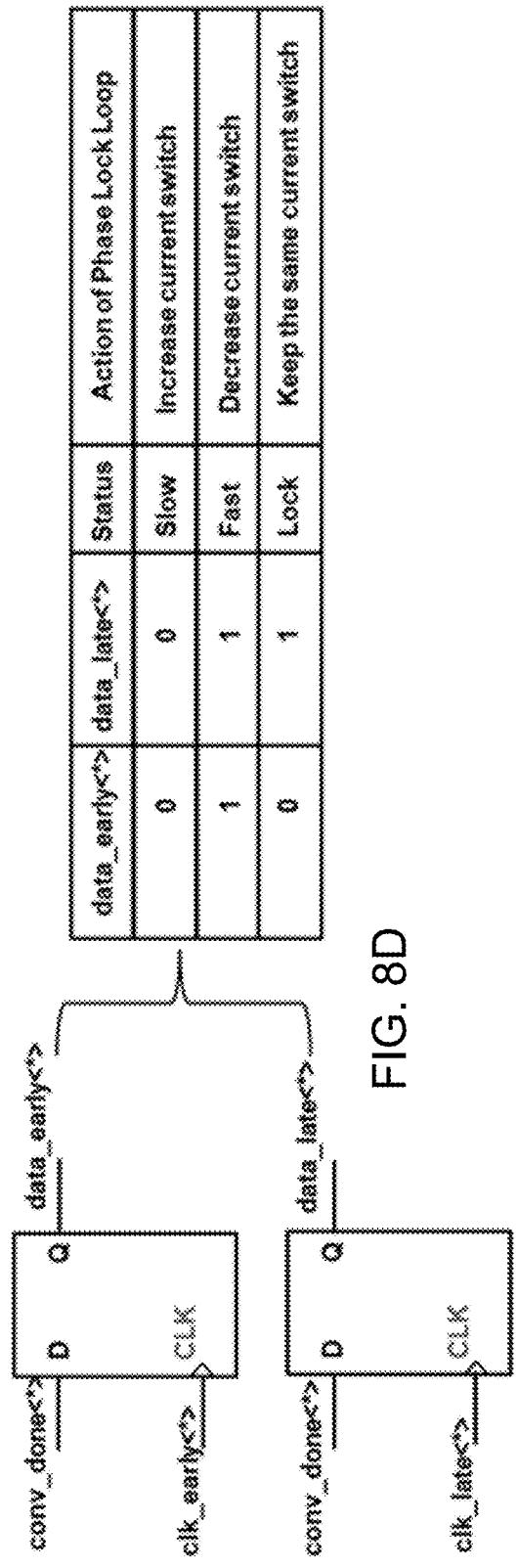

ASYNCHRONOUS SAR ADC WITH ADAPTIVE TUNING COMPARATOR

BACKGROUND

Field

This disclosure relates to the field of analog-to-digital converters, devices, components and methods.

Description of the Related Art

An analog-to-digital converter (ADC) is an electronic component that converts an analog voltage or current input to a digital output representing the magnitude of the voltage or current. ADCs are used in many modern electronic devices including video, voice and music recorders; mobile phones; computers; communications equipment; scientific instruments and data acquisition systems.

A successive approximation ADC (sometimes referred to as a successive approximation register ADC or SAR ADC) is a popular type of analog-to-digital converter that carries out the conversion by employing a binary search through possible quantization levels before converging on a digital output. SAR ADCs typically contain a digital-to-analog converter (DAC), a comparator, and control circuitry—including a successive approximation register (SAR) and additional logic circuitry—that coordinate to execute the binary search. A synchronous SAR ADC is a traditional type used in integrated circuit successive approximation ADCs.

In recent years, an asynchronous SAR ADC has been developed that may provide faster conversion than the synchronous SAR ADCs. This is because a total conversion time may be used more efficiently. Specifically, while synchronous SAR ADCs use exactly the same time period for each conversion step, asynchronous SAR ADCs may time each conversion step according to its actual input signal, i.e., a larger input difference may have a shorter time period for its conversion step.

The speed and noise of asynchronous SAR ADCs, however, may be limited by the comparator parameters for high speed and high-resolution applications. A tradeoff between the comparator's speed and noise may restrict SNR performance for high speed asynchronous SAR ADCs at high resolution. To achieve a low input-referred noise comparator, an adequate integration time interval for the comparator may be needed, and this may restrict the speed of an asynchronous SAR ADC for each conversion step. For high resolution and low noise applications, the speed of the comparator may become a major constraint for high speed asynchronous SAR ADCs. In addition, to ensure that all SAR conversion steps (MSB, MSB-1, . . . , LSB+1, LSB) can be completed over all conditions, the conversion time of an asynchronous SAR ADC may not be fully utilized over the variations of the device and supply voltage. This may further limit the performance of asynchronous SAR ADCs.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 8A-8D illustrate aspects of phase lock loop timing and circuitry for an asynchronous SAR ADC according to some embodiments of the present disclosure.

DETAILED DESCRIPTION

Figure 1:
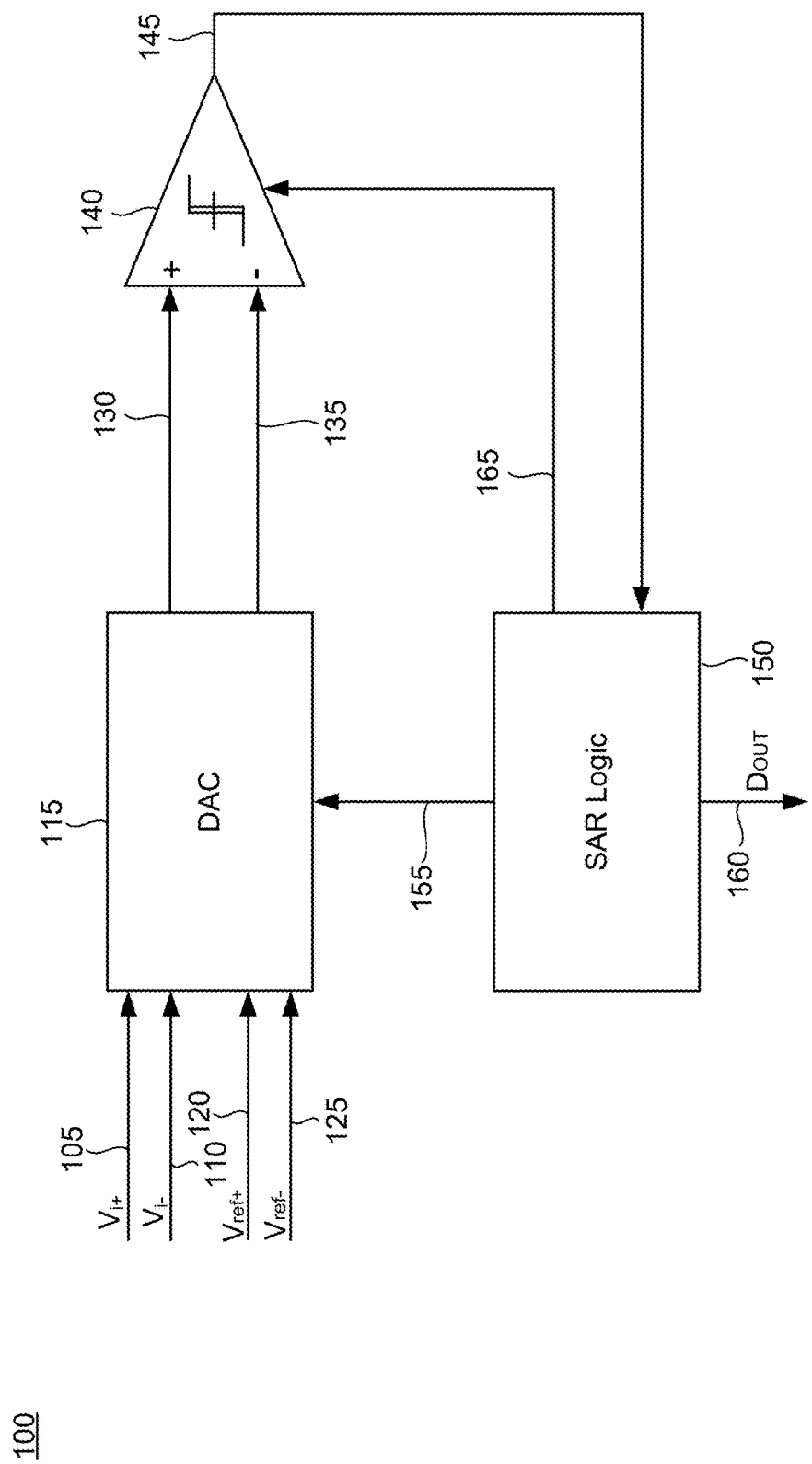
FIG. 1 illustrates a SAR ADC according to some embodiments of the present disclosure.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology is not limited to the specific details set forth herein and may be practiced using one or more implementations. In one or more instances, structures and components are shown in simplified form in order to avoid obscuring the concepts of the subject technology.

Referring now to the drawings, wherein like reference numerals designate identical or corresponding parts throughout the several views, exemplary aspects of the disclosure include an asynchronous successive approximation ADC with an adaptive tuning comparator.

FIG. 1 illustrates a SAR ADC 100 according to some embodiments of the present disclosure. In FIG. 1, a differential analog input signal (between $V_{i+}$ 105 and $V_{i-}$ 110) and a differential reference voltage (between $V_{ref+}$ 120 and $V_{ref-}$ 125) may be applied to digital-to-analog converter (DAC) 115. The outputs 130 and 135 from DAC 115 may represent versions of the differential analog input signal (between $V_{i+}$ 105 and $V_{i-}$ 110) and an analog version of test signals 155 from SAR logic 150. Outputs 130 and 135 from DAC 115 may be applied to the positive and negative inputs of comparator 140. The comparator output 145 of comparator 140 may be a logic level ("1" or "0") representing a comparison of the outputs 130 and 135 from DAC 115. Comparator output 145 may be connected to SAR logic 150. SAR logic 150 is the control circuitry for SAR ADC 100. SAR logic 150 may provide a digital output $D_{OUT}$ 160 that may represent the digital equivalent (or approximation) of the differential analog input signal (between $V_{i+}$ 105 and $V_{i-}$ 110). SAR logic 150 may also provide a comparator control signal 165 to comparator 140 that may be used by comparator 140 to adjust one or more parameters of comparator 140. At the start of a typical conversion operation, DAC 115 may sample the differential analog input signal (between $V_{i+}$ 105 and $V_{i-}$ 110). During conversion, SAR logic 150 coordinates test signals 155 to DAC 115 based on comparator output 145 from comparator 140, to find the closest digital equivalent of differential analog input signal (between $V_{i+}$ 105 and $V_{i-}$ 110).

Those skilled in the art will readily appreciate that a successive approximation ADC with any number of bits of resolution (N) may be implemented by selecting the appropriate structure of DAC 115 and stages in the SAR logic 150. In embodiments of the present disclosure, the number of bits of resolution (N) should be greater than one. In some embodiments, DAC 115 may be implemented using switched capacitor networks. Such a circuit is commonly referred to as a capacitor-based digital-to-analog converter (CDAC). Other types of digital-to-analog converters may also be used.

Figure 2A:
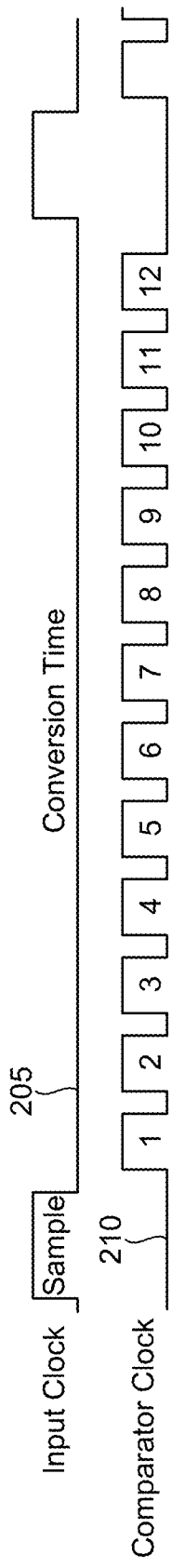
FIG. 2A illustrates an exemplary timing diagram for a synchronous SAR ADC.

FIG. 2A illustrates an exemplary timing diagram for a synchronous SAR ADC. In a synchronous SAR ADC, an input clock 205 may enable the sampling of an input signal at the beginning of a conversion cycle. During conversion, a comparator clock 210 signals each step of the conversion cycle. FIG. 2A illustrates 12 steps (12 bits of output resolution) for each conversion cycle but, as discussed above, any number of steps (bits of resolution) greater than one may be employed. FIG. 2A illustrates that, in a synchronous SAR ADC, all of the steps of the conversion cycle are of a same time period.

Figure 2B:
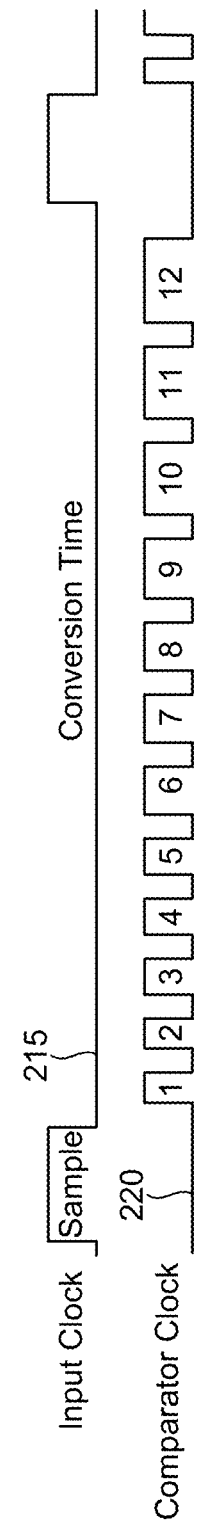
FIG. 2B illustrates an exemplary timing diagram for an asynchronous SAR ADC.

FIG. 2B illustrates an exemplary timing diagram for an asynchronous SAR ADC. In an asynchronous SAR ADC, an input clock 215 may enable the sampling of an input signal at the beginning of a conversion cycle. During conversion, a comparator clock 220 signals each step of the conversion cycle. FIG. 2B illustrates that, in an asynchronous SAR ADC, each of the steps of the conversion cycle may be a different time period. This may allow for faster overall conversion time than a similar synchronous SAR ADC. Specifically, an asynchronous SAR ADC can be faster than a similar synchronous SAR ADC because the total conversion time is used more efficiently by each conversion step according to its actual input signal. For example, a larger input difference may have a shorter time period for its conversion step.

However, the conversion cycles would be finished much earlier before the total conversion time ends due to the variation of device and supply voltage for asynchronous SAR ADCs. The speed difference, in some instances, between the fast and slow corners may be large (as much as 50%). Therefore, the speed and SNR of an asynchronous SAR ADC may not be optimized at all conditions for low power because there is a trade-off between speed and noise for comparator.

In an embodiment, an asynchronous SAR ADC with an adaptive tuning comparator allows a selective tail current (adjustable integration time) at each conversion step to fully utilize the total conversion time and improve the speed, SNR and power requirements.

Figure 3:
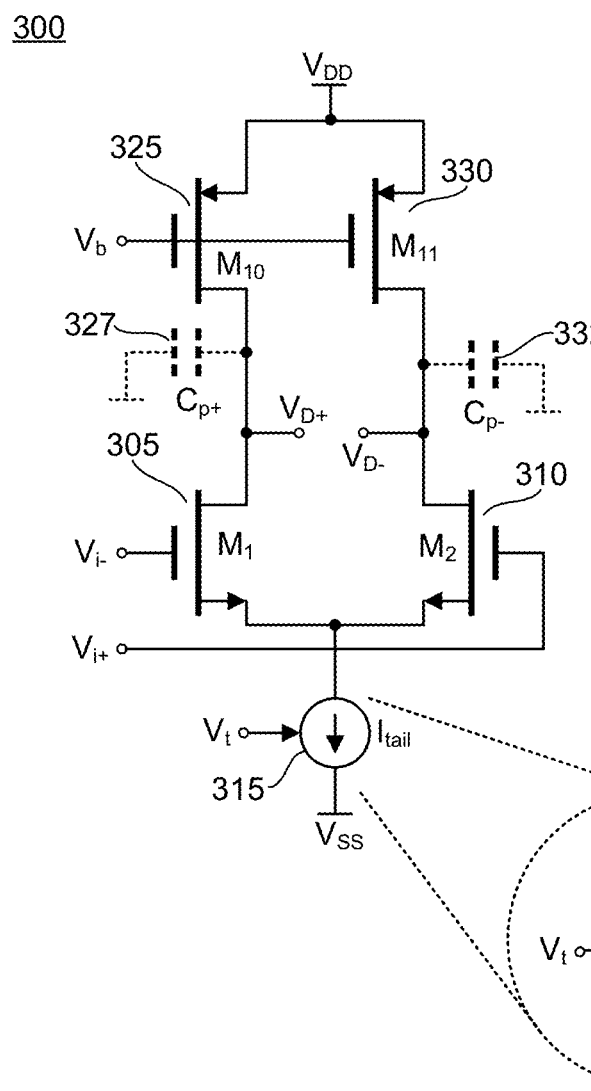
FIG. 3 illustrates an exemplary CMOS differential comparator that may be employed in an asynchronous SAR ADC according to some embodiments of the present disclosure.

FIG. 3 illustrates an exemplary CMOS differential comparator 300 that may be employed in an asynchronous SAR ADC according to some embodiments of the present disclosure. CMOS differential comparator 300 includes a differential input pair $M_1$ 305 and $M_2$ 310 (which may be implemented by, for example, N-channel Metal-Oxide-Semiconductor Field-Effect-Transistors—MOSFETs), one or more tail current control devices (tail current source 315 in FIG. 3, for example), and reset switches $M_{10}$ 325 and $M_{11}$ 330 (which may be implemented by, for example, a pair of P-channel MOSFETs). CMOS differential comparator 300 may accept inputs $V_{i-}$ and $V_{i+}$ on differential input pair $M_1$ 305 and $M_2$ 310 respectively, and provide outputs $V_{D+}$ and $V_{D-}$. Capacitive loads at $V_{D+}$ and $V_{D-}$ are denoted in FIG. 3 as $C_{p+}$ 327 and $C_{p-}$ 332, respectively. When CMOS differential comparator 300 is reset, both the reset switches $M_{10}$ 325 and $M_{11}$ 330 begin to charge $C_{p+}$ 327 and $C_{p-}$ 332 until both $V_{D+}$ and $V_{D-}$ reach $V_{DD}$. When CMOS differential comparator 300 is active, both the reset switches $M_{10}$ 325 and $M_{11}$ 330 are turned OFF, and the tail current source 315 is turned on. The outputs $V_{i+}$ and $V_{D-}$ are both discharged from $V_{DD}$ toward ground, and the discharge time interval is defined as the integration time of the comparator. The noise bandwidth at the differential output between $V_{D+}$ and $V_{D-}$ may be a function of the integration time (i.e., a longer integration time may achieve a smaller input referred noise for the comparator). If $V_{i+}$ is higher than $V_{i-}$, $V_{D-}$ may be discharged to ground faster than $V_{i+}$ because more current flows through $M_2$ 310 to discharge $C_{p-}$ 332 from $V_{DD}$ to ground. However, if the tail current is too large, both $V_{D+}$ and $V_{D-}$ would be discharged from $V_{DD}$ to ground in a very short time. That may lead to a small integration time for the differential output between $V_{D+}$ and $V_{D-}$. Also, the differential output may become smaller and the comparator noise may increase. In contrast, a smaller tail current may achieve a longer integration and a larger differential output, but the conversion time of CMOS differential comparator 300 may become longer for each conversion step. As such, it may be important to have the flexibility to program the tail current for each conversion step from MSB to LSB. In some embodiments, the tail current control devices may be implemented by, for example, one or more N-channel MOSFETs ($M_6$ 320 in FIG. 3). The tail current control devices may be adjusted dynamically (during a conversion cycle) using a control voltage Vt (from SAR ADC control circuitry, for example) to more effectively use the conversion time and improve SNR and power efficiency. Additionally, control voltage Vt may be provided by SAR ADC control circuitry, for example, and may be used to enable or disable the CMOS differential comparator 300.

Figure 4:
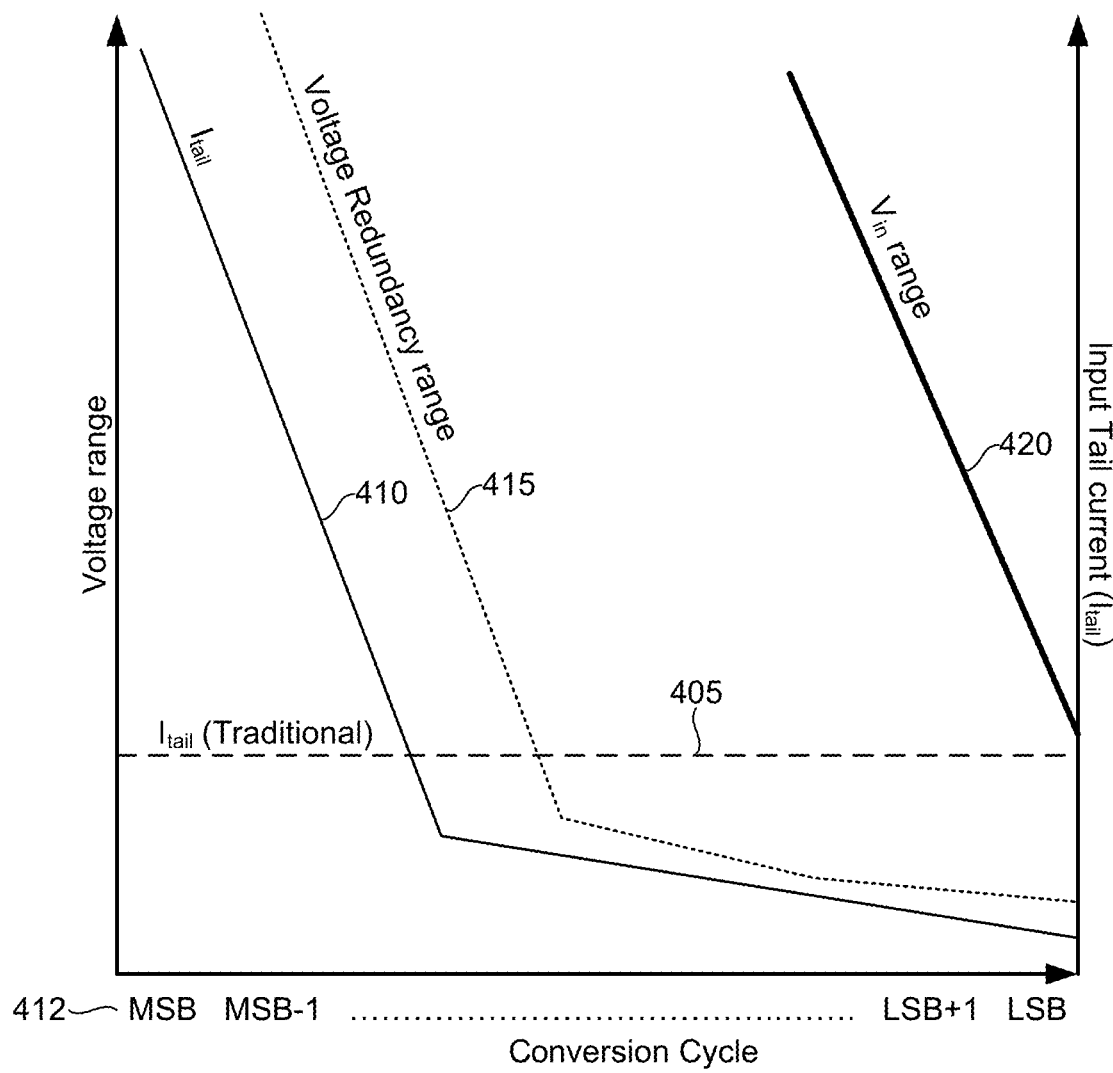
FIG. 4 illustrates a graph of comparator tail current, input voltage range, and CDAC voltage redundancy range vs. conversion cycles from MSB to LSB according to some embodiments of the present disclosure.

FIG. 4 illustrates a graph 400 of comparator tail current, input voltage range, and CDAC voltage redundancy range vs. conversion cycles from MSB to LSB according to some embodiments of the present disclosure. Graph 400 illustrates a traditional (constant from MSB to LSB) comparator tail current 405. The traditional comparator tail current 405 must be kept large enough to complete all conversion cycles. In contrast, in an adaptive tuning comparator, tail current $I_{tail}$ 410 allows for the selection of an appropriate tail current (adjustable integration time) for each conversion step (from MSB to LSB) that may more effectively use the conversion time, leading to improved speed, increased SNR and lower overall power requirements.

Also illustrated in FIG. 4 is voltage redundancy range 415 of the CDAC, which may be used, in some embodiments, to tolerate the error during MSB to LSB conversions. To add the voltage redundancy range in CDAC, one or more redundant bits may be added between the MSB and LSB. For example, if we have MSB, MSB-1, Redundant-MSB-1, MSB-2, . . . , MSB-6, MSB-7, Redundant-MSB-7, LSB+5, Redundant-LSB+5, LSB+4, LSB+3, LSB+1, LSB, those added redundant bits (Redundant*) provide the voltage redundancy range that can tolerate the error. If, for example, there are any errors at the output data for MSB and MSB-1, Redundant-MSB-1 may correct these errors. Also, if there are errors between MSB-2 and MSB-7, Redundant-MSB-7 may correct these errors. However, Redundant-MSB-1 cannot correct the errors between MSB-2 and LSB since the output of Redundent_MSB-1 is generated before any errors between MSB-2 and LSB occur. For example, binary bits "MSB, MSB-1, LSB+1, LSB" have binary weights <8,4,2,1>. If the output data is 1100, this indicates that the reconstructed output becomes "1*8+1*4+0*2+0*1=12". If one redundant bit is added between MSB-1 and LSB+1, the corresponding weight is <8,4,3,2,1>. If there are errors at MSB-1, and the output becomes <1,0,1,0,1>, the reconstructed output should be "1*8+4*0+1*3+0*2+1*1=12". In this case, the redundant bit may help correct the error of MSB-1. Without the redundant bit, the output would be <1,0,1,1>, and the reconstructed output would become "1+8+0*4+2*1+1*1=11", which is different from the actual input voltage. As illustrated, the large noise error due to high tail current of first several cycles (MSB, MSB-1, . . . ) may be corrected by the following conversion cycles (LSB+n, . . . , LSB). Graph 400 also illustrates the reduction of $V_{in}$ range 420 from MSB to LSB. The $V_{in}$ range 420 may grow smaller as each conversion step provides the output to CDAC, and eventually the $V_{in}$ range 420 reaches a minimum when the LSB output is generated. As the $V_{in}$ range 420 becomes smaller, then a smaller voltage redundancy range may be enough to tolerate the error during the rest of the conversion cycle. For the last several conversion step (LSB, LSB+1, . . . , etc.), a much smaller tail current may be used to achieve the lowest noise for the comparator. As a result, the noise performance of the SAR ADC is constrained by the comparator noise at the last several conversion steps.

Figure 5:
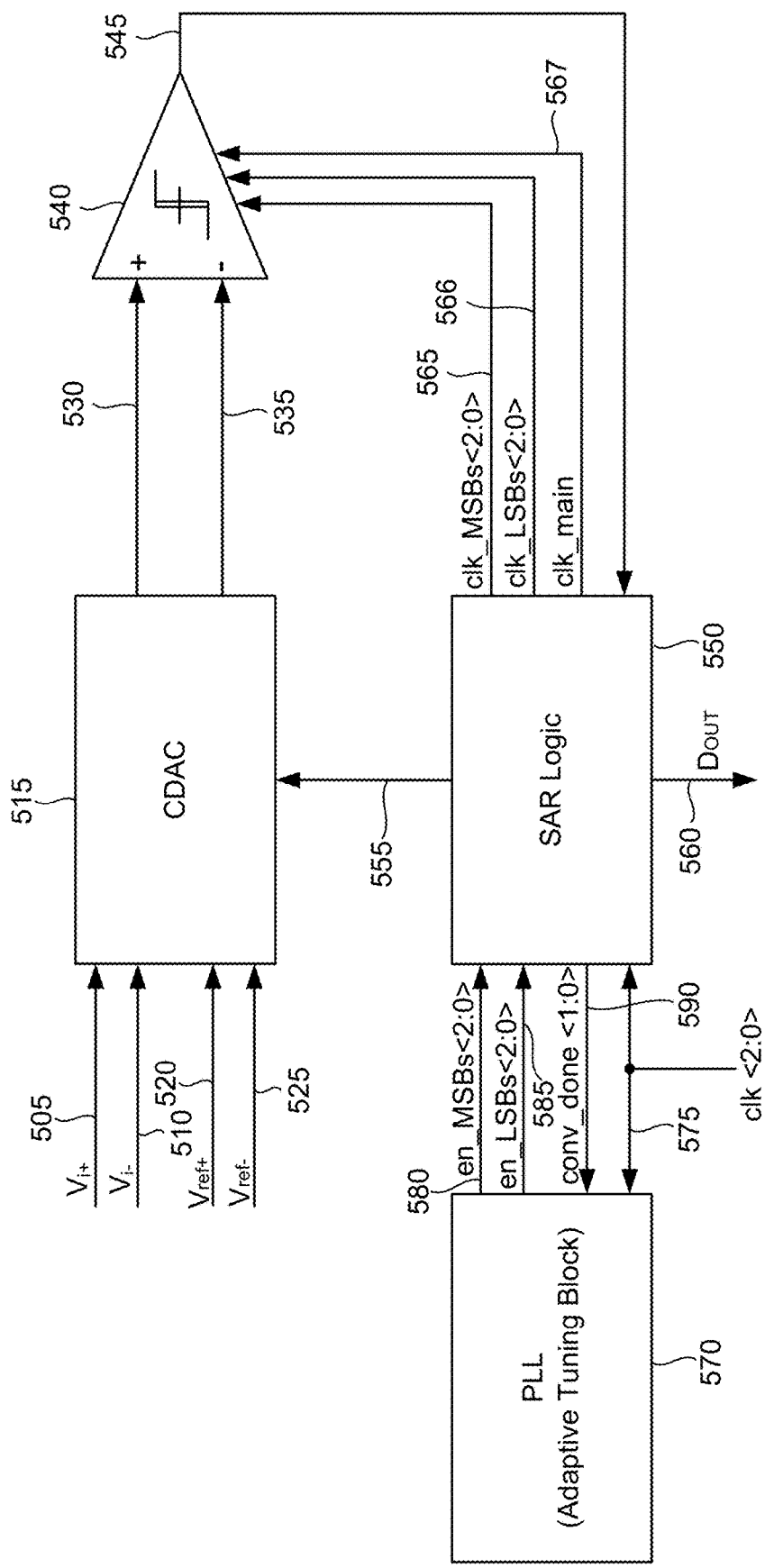
FIG. 5 illustrates another SAR ADC according to some embodiments of the present disclosure.

FIG. 5 illustrates another SAR ADC 500 according to some embodiments of the present disclosure. In FIG. 5, the successive approximation ADC 500, according to some embodiments, may be implemented using a capacitive DAC (CDAC) 515, an adaptive tuning comparator 540, SAR logic 550, and phase lock loop 570. In FIG. 5, a differential analog input signal (between $V_{i+}$ 505 and $V_{i-}$ 510) and a differential reference voltage (between $V_{ref+}$ 520 and $V_{ref-}$ 525) may be applied to CDAC 515. The outputs 530 and 535 from CDAC 515 may represent versions of the differential analog input signal (between $V_{i+}$ 505 and $V_{i-}$ 510) and an analog version of test signals 555 from SAR logic 550. Outputs 530 and 535 from CDAC 515 may be applied to the positive and negative inputs of adaptive tuning comparator 540.

The comparator output 545 of adaptive tuning comparator 540 may be a logic level ("1" or "0") representing a comparison of the outputs 530 and 535 from CDAC 515. Comparator output 545 may be connected to SAR logic 550. SAR logic 550 may provide a digital output $D_{OUT}$ 560 that may represent the digital equivalent (or approximation) of the differential analog input signal (between $V_{i+}$ 505 and $V_{i-}$ 510). SAR logic 550 may also provide comparator clock signals 565, 566, and 567 to adaptive tuning comparator 540. Phase lock loop 570 may be configured to receive input clock (clk<2:0>) 575 from a master clock generator (not shown) and feedback signals (conv_done <1:0>) 590 from SAR logic 550, and to generate two or more groups of control signals. In the example illustrated in FIG. 5, there are two groups of control signals: en_MSBs<2:0> 580 and en_LSBs<2:0> 585.

At the start of a typical conversion operation, CDAC 515 may sample the differential analog input signal (between $V_{i+}$ 505 and $V_{i-}$ 510). During conversion, SAR logic 550 may coordinate test signals 555 to CDAC 515 based on comparator output 545 from adaptive tuning comparator 540, to find the closest digital equivalent of differential analog input signal (between $V_{i+}$ 505 and $V_{i-}$ 510). More specifically, on each conversion step, SAR logic 550 may adjust test signals 555 to implement a binary search. For example, test signals 555 may be set, during a first step, to a midscale value. This may produce, on the CDAC 515 output 535 a value of $V_{ref}/2$ where $V_{ref}$ is the reference voltage (between $V_{ref+}$ 520 and $V_{ref-}$ 525) provided to CDAC 515. A comparison may then be performed in adaptive tuning comparator 540 to determine if differential analog input signal (between $V_{i+}$ 505 and $V_{i-}$ 510) is less than or greater than the analog version of test signals 555. Based on the comparator output 545, SAR logic 550 may adjust test signals 555 to continue the binary search for each conversion step until the conversion is complete and the final digital output is available on $D_{OUT}$ 560 of SAR logic 550.

The input clock group (clk<2:0>) 575 and comparator output 545 may be used by SAR logic 550 to generate comparator clock (clk_main) 567. Additionally, several groups of clocks may be generated by SAR logic 550 and controlled (enabled) by phase lock loop 570. In the example illustrated in FIG. 5, there are two groups of clocks: clk_MSBs<2:0> 565 for the most significant bits (MSBs 1~8), and clk_LSBs<2:0> 566 for the least significant bits (LSBs 9~12). In other embodiments, more than two clock groups may be used to enable additional or enhanced control of adaptive tuning comparator 540. Each group of the clocks may be an array of input clock signal (for example, clk_MSBs<2:0>). When all conversion cycles are completed for conversion cycles of MSBs and LSBs, conv_done<1> and conv_done<0> become high, respectively.

Each clock group generated by SAR logic 550 may be controlled by SAR logic 550 based on an enable signal group (for example, en_MSBs<2:0>) from phase lock loop 570. When a particular enable signal is low, for example, the corresponding output clock may remain at a logic low level (clock is disabled), i.e., if en_MSBs<2>=0, then clk_MSBs<2>=0. When a particular enable signal is high, for example, the corresponding output clock may be active.

Figure 6:
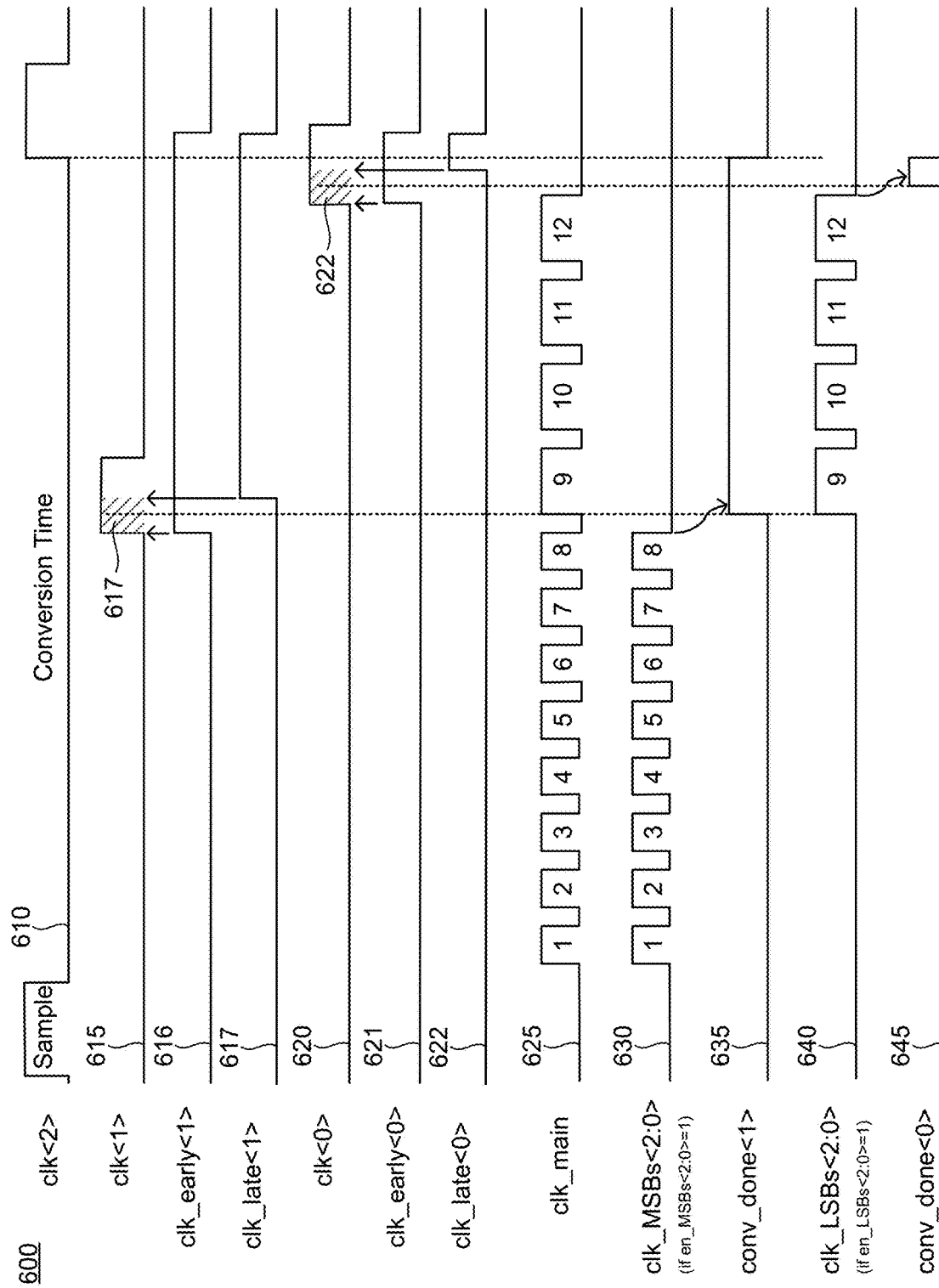
FIG. 6 illustrates a timing diagram indicative of an implementation of an adaptive tuning comparator asynchronous SAR ADC according to some embodiments of the present disclosure.

FIG. 6 illustrates a timing diagram 600 indicative of an implementation of an adaptive tuning comparator asynchronous SAR ADC according to some embodiments of the present disclosure. Referring to FIG. 6, the clock group clk<2:0> (610, 615 and 620) provides three key timing windows for each conversion cycle. clk<2> 610 may indicate, for example, the start of a conversion cycle and the time during which an analog input signal sample may be acquired. clk<1> 615 may indicate, for example, a clock window 617 signifying the end of a particular conversion phase (MSBs, for example). clk<0> 620 may indicate, for example, a second clock window 622 that may signify the end of another conversion phase (LSBs, for example).

As illustrated in FIG. 6, the phase lock loop 570 may use feedback signals (for example, the rising edge of conv_done<1:0>) to adjust the enable signals of en_MSBs<2:0> and en_LSBs<2:0> accordingly. Eventually, the speed of adaptive tuning comparator 540 will be altered so that the rising edge of each of the conv_done<1:0> signals (635 and 645) stays inside the clock window (617 and 622) of each of the respective clk<1:0> signals (615 and 620).

Figure 7:
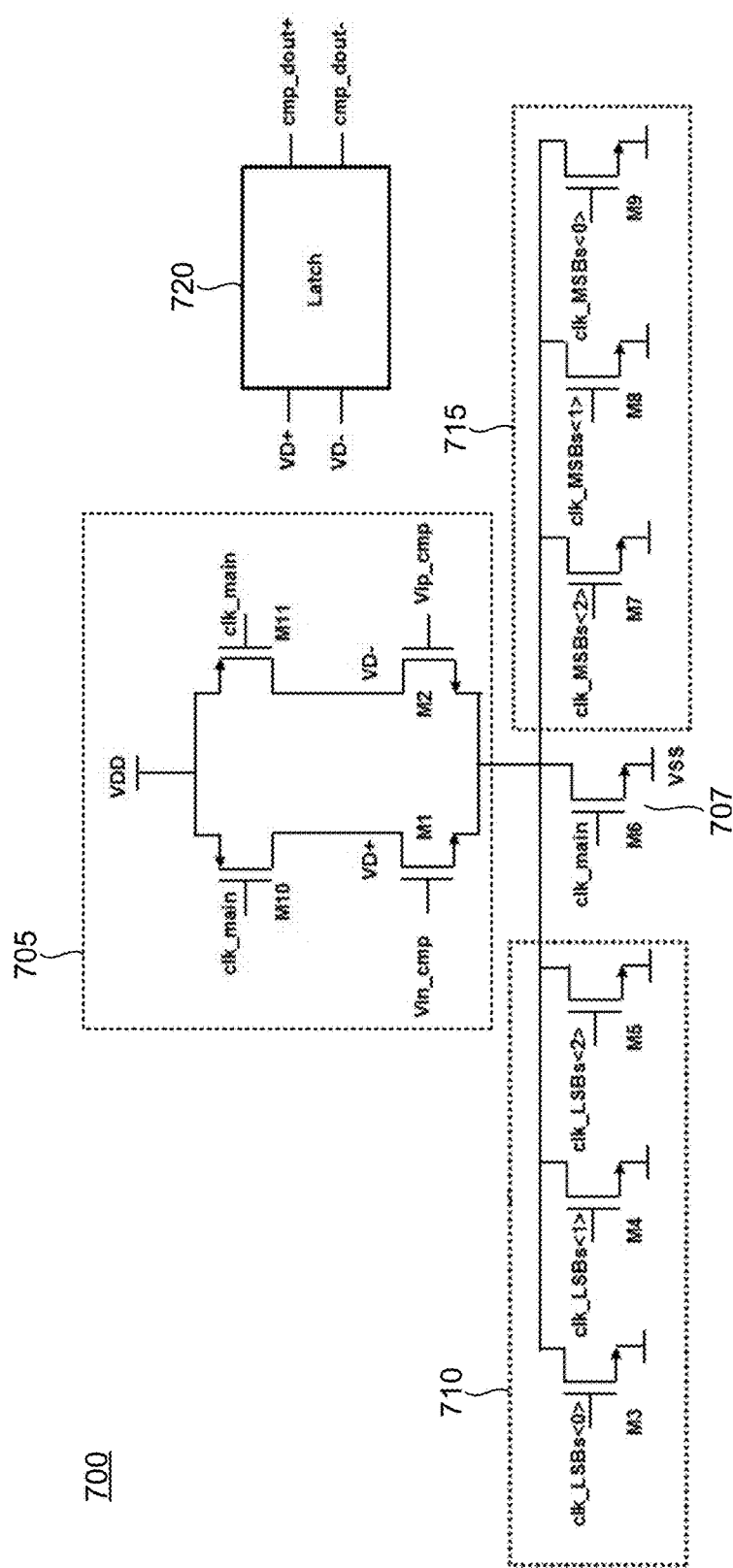
FIG. 7 illustrates an exemplary circuit diagram of an adaptive tuning comparator 700 according to some embodiments of the present disclosure.

FIG. 7 illustrates an exemplary circuit diagram of an adaptive tuning comparator 700 according to some embodiments of the present disclosure. Adaptive tuning comparator 700 includes a differential comparator 705, a main tail current device M6 707, one or more tail current devices in a first tail current device group 710 (although three tail current devices—M3, M4 and M5—are shown in the first tail current device group 710, any number of tail current devices greater than or equal to one are possible), one or more tail current devices in a second tail current device group 715 (although three tail current devices—M7, M8 and M9—are shown in the second tail current device group 715, any number of tail current devices greater than or equal to one are possible) and latch 720.

Referring now to FIGS. 6 and 7, when clk_main 625 is a logic low, the adaptive tuning comparator 700 may be in a reset mode. When reset, M10 and M11 in differential comparator 705 reset the voltage of comparator outputs VD+ and VD− to VDD, and tail current device M6 707 is turned off. When clk_main 625 is a logic high, tail current device M6 707 is turned on. At the same time clk_MSBs<2:0> 630 may turn on one or more tail current devices in the second tail current device group 715 or clk_LSBs<2:0> 630 may turn on one or more tail current devices in the first tail current device group 710. The voltage of VD+ and VD− would be discharged from VDD to GND.

When more clocks of clk_MSBs<2:0> 630 or clk_LSBs<2:0> 640 are enabled, the speed of discharge may be increased. This may cause a conversion step to become shorter, but also lead to an increase in input noise due to a smaller integration time for VD+ and VD−. The voltage difference between VD+ and VD− may be connected to latch 720, and the output of the latch 720 may form the outputs cmp_dout+ and cmp_dout− of adaptive tuning comparator 700.

For embodiments as shown in FIG. 6, during the MSB conversion steps (1st to 8th steps), clk_MSBs<2:0> 630 will follow clk_main 625. When conv_done<1> 635 is slower than the clock window 617 of clk<1> 615 (lags), the phase lock loop may enable more clocks for clk_MSBs<2:0> 630. This may cause the conversion steps for the MSBs to become shorter, which may tend to move the leading (rising) edge of conv_done<1> 635 into clock window 617 of clk<1> 615. If conv_done<1> 635 is faster than the clock window 617 of clk<1> 615 (leads), the phase lock loop may enable fewer clocks for clk_MSBs<2:0> 630. This same mechanism may be applied to LSB conversion steps (9th to 12th) for clk_LSBs<2:0> 640 and conv_done<0> 645. For LSB conversion steps (9th to 12th), the noise of adaptive tuning comparator 700 may be much smaller due to a much longer integration time, which may define the final comparator noise and the SNR of the asynchronous SAR ADC 500.

FIGS. 8A-8D illustrate aspects of the phase lock loop 570 timing and circuitry for asynchronous SAR ADC 500. These figures, along with FIG. 6, illustrate how the status of the conversion done signals (conv_done<1> and conv_done<0>) may be used to detect and control the conversion speed for MSBs and LSBs, respectively.

As shown in FIG. 6, clk<1> may be used to generate the clock window between clkearly<1> 616 and clk_late<1> 617. Time delay cells, for example, may be used to generate clk_early<1> and clk_late<1> from clk<1>. Similarly, clk<0> may be used to generate clk_early<0> 621 and clk_late<0> 622. As illustrated in FIGS. 8A-8C, the rising edge between clk_early<*> and clk_late<*> define a clock window for conv_done<*> to be locked in, where *=1 or 2. clk_early<*> and clk_late<*> may, in some embodiments, be generated from input clocks clk<*>.

As shown in FIG. 8D, when conversion speed is too slow, both of the detected results would produce a logic 0 from the two D flip-flops (data_early<*> and data_late<*>). In this situation, phase lock loop 570 may enable more tail current switches in comparator 540 to increase the speed (reduce integration time). When conversion speed is too fast, both of the detected results would produce a logic 1 from the two D flip-flops (data_early<*> and data_late<*>). In this situation, phase lock loop 570 may enable fewer tail current switches in comparator 540 to decrease the speed (increase integration time).

When phase lock loop 570 is in the lock status (data_early<*>=0 and data_late<*>=1), the tail current switches in comparator 540 are maintained in their current state.

In some embodiments, the phase lock loop 570 may be implemented with a much slower clock frequency than clk<*> to save power and area.

Figure 9:
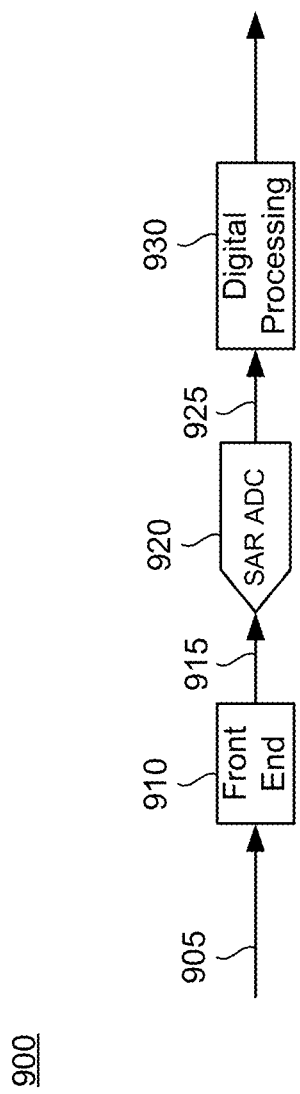
FIG. 9 illustrates a simplified functional block diagram of one class of applications (communication receiver) for a SAR ADC with an adaptive tuning comparator.

FIG. 9 illustrates a simplified functional block diagram of one class of applications (communication receiver 900) for a SAR ADC with an adaptive tuning comparator like that disclosed above. Communication receiver 900 may be part of a bidirectional communication system that may include a transmitter (not shown), or may be part of a stand-alone receiver (such as a broadcast television or radio receiver). In FIG. 9, an analog signal 905 from, for example, an antenna, a coaxial cable, a fiber optic cable, a twisted pair cable, is fed into a front end circuit 910. Analog signal 905 may be an RF or other high frequency carrier modulated with analog or digital information. Front end circuit 910 may include one or more low-noise amplifiers, tuners, mixers, filters, and the like. The output 915 from front end circuit 910 may be a baseband or intermediate frequency analog signal. The output 915 from front end circuit 910 may be received by SAR ADC 920 for conversion to digital form. SAR ADC 920 may include adaptive tuning comparator circuitry to reduce ADC conversion time and improve performance. Digital output 925 from SAR ADC 920 may be fed into digital processing circuitry 930 for further processing in the digital domain.

Various embodiments of the invention are contemplated in addition to those disclosed hereinabove. The above-described embodiments should be considered as examples of the present invention, rather than as limiting the scope of the invention. In addition to the foregoing embodiments of the invention, review of the detailed description and accompanying drawings will show that there are other embodiments of the present invention. Accordingly, many combinations, permutations, variations and modifications of the foregoing embodiments of the present invention not set forth explicitly herein will nevertheless fall within the scope of the present invention.

The invention claimed is:

1. A successive approximation analog-to-digital converter for converting an analog input signal to a digital output, the successive approximation analog-to-digital converter comprising:
    a digital-to-analog converter;
    a comparator with adjustable integration time electrically coupled to the digital-to-analog converter; and
    control circuitry electrically coupled to the digital-to-analog converter and the comparator, the control circuitry configured to adjust an integration time of the comparator, one or more times during a conversion cycle, to be longer for a least significant bit than for a most significant bit.

2. The successive approximation analog-to-digital converter of claim 1, wherein the control circuitry is further configured to adjust the integration time of the comparator by changing a tail current of a differential input pair in the comparator.

3. The successive approximation analog-to-digital converter of claim 2, wherein the control circuitry is further configured to change the tail current of the differential input pair in the comparator by enabling or disabling clock signals to one or more tail current control devices in the comparator.

4. The successive approximation analog-to-digital converter of claim 3, further comprising:
a phase lock loop circuit, wherein
the phase lock loop circuit is configured to provide a plurality of enable signals to the control circuitry, and
the control circuitry is further configured to enable or disable clock signals to the one or more tail current control devices in the comparator based on the plurality of enable signals provided by the phase lock loop circuit.

5. The successive approximation analog-to-digital converter of claim 4, wherein the phase lock loop circuit is further configured to provide enable signals based on one or more feedback signals from the control circuitry.

6. The successive approximation analog-to-digital converter of claim 2, wherein
the comparator comprises the differential input pair, and
the differential input pair includes N-channel Metal-Oxide-Semiconductor Field-Effect-Transistors (MOSFETs).

7. A successive approximation analog-to-digital converter comprising:
a digital-to-analog converter;
a comparator electrically coupled to the digital-to-analog converter; and
control circuitry electrically coupled to the digital-to-analog converter and the comparator, the control circuitry configured to adjust an integration time of the comparator one or more times during a conversion cycle, wherein
the comparator comprises:
a differential input pair;
at least three tail current control devices electrically coupled to the differential input pair;
a current source output load circuit; and
a latch.

8. The successive approximation analog-to-digital converter of claim 7, wherein the control circuitry is further configured to adjust the integration time of the comparator to be longer for a least significant bit than for a most significant bit.

9. The successive approximation analog-to-digital converter of claim 7, wherein the control circuitry is further configured to adjust the integration time of the comparator by changing a tail current of the differential input pair in the comparator.

10. The successive approximation analog-to-digital converter of claim 9, wherein the control circuitry is further configured to change the tail current of the differential input pair in the comparator by enabling or disabling clock signals to one or more of the at least three tail current control devices in the comparator.

11. The successive approximation analog-to-digital converter of claim 10, further comprising a phase lock loop circuit, wherein the phase lock loop circuit is configured to provide a plurality of enable signals to the control circuitry and the control circuitry is further configured to enable or disable clock signals to the at least three tail current control devices in the comparator based on the plurality of enable signals provided by the phase lock loop circuit.

12. The successive approximation analog-to-digital converter of claim 11, wherein the phase lock loop circuit is further configured to provide enable signals based on one or more feedback signals from the control circuitry.

13. The successive approximation analog-to-digital converter of claim 7, wherein each of the at least three tail current control devices are N-channel Metal-Oxide-Semiconductor Field-Effect-Transistors (MOSFETs).

14. The successive approximation analog-to-digital converter of claim 7, wherein the differential input pair includes N-channel Metal-Oxide-Semiconductor Field-Effect-Transistors (MOSFETs).

15. A successive approximation analog-to-digital converter for converting an analog input signal to a digital output, the successive approximation analog-to-digital converter comprising:
a digital-to-analog converter;
a comparator with adjustable integration time electrically coupled to the digital-to-analog converter; and
control circuitry electrically coupled to the digital-to-analog converter and the comparator, the control circuitry configured to adjust an integration time of the comparator, one or more times during a conversion cycle, by changing a tail current of a differential input pair in the comparator.

16. The successive approximation analog-to-digital converter of claim 15, wherein the control circuitry is further configured to change the tail current of the differential input pair in the comparator by enabling or disabling clock signals to one or more tail current control devices in the comparator.

17. The successive approximation analog-to-digital converter of claim 16, further comprising:
a phase lock loop circuit, wherein
the phase lock loop circuit is configured to provide a plurality of enable signals to the control circuitry, and
the control circuitry is further configured to enable or disable clock signals to the one or more tail current control devices in the comparator based on the plurality of enable signals provided by the phase lock loop circuit.

18. The successive approximation analog-to-digital converter of claim 17, wherein the phase lock loop circuit is further configured to provide enable signals based on one or more feedback signals from the control circuitry.

19. The successive approximation analog-to-digital converter of claim 15, wherein the comparator comprises at least three tail current control devices electrically coupled to the differential input pair, each of the at least three tail current control devices being N-channel Metal-Oxide-Semiconductor Field-Effect-Transistors (MOSFETs).

20. The successive approximation analog-to-digital converter of claim 15, wherein
the comparator comprises the differential input pair, and
the differential input pair includes N-channel Metal-Oxide-Semiconductor Field-Effect-Transistors (MOSFETs).

* * * * *